United States Patent
Zheng et al.

(10) Patent No.: US 9,589,666 B2
(45) Date of Patent: Mar. 7, 2017

(54) AMORPHOUS SILICON GATE DRIVING CIRCUIT, FLAT PANEL SENSOR AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Yajie Zheng, Shanghai (CN); Yan Ling, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 80 days.

(21) Appl. No.: 14/522,560

(22) Filed: Oct. 23, 2014

(65) Prior Publication Data

US 2015/0187433 A1 Jul. 2, 2015

(30) Foreign Application Priority Data

Dec. 26, 2013 (CN) .......................... 2013 1 0733038

(51) Int. Cl.
G09G 3/36 (2006.01)
G11C 19/28 (2006.01)
(Continued)

(52) U.S. Cl.
CPC .............. *G11C 19/287* (2013.01); *G09G 3/20* (2013.01); *G09G 3/32* (2013.01); *H04N 5/374* (2013.01);
(Continued)

(58) Field of Classification Search
CPC .............. G09G 3/3266; G09G 3/3674; G09G 2310/0267; G09G 2310/0286; G09G 3/20;
(Continued)

(56) References Cited

U.S. PATENT DOCUMENTS

2006/0061535 A1* 3/2006 Kim ...................... G09G 3/3677
345/98
2008/0018613 A1* 1/2008 Kim ...................... G06F 3/0412
345/173
(Continued)

FOREIGN PATENT DOCUMENTS

CN 1753072 A 3/2006
CN 101281719 A 10/2008
(Continued)

Primary Examiner — Premal Patel
(74) Attorney, Agent, or Firm — Anova Law Group, PLLC (57) ABSTRACT

An amorphous silicon gate driving circuit includes multiple cascaded shift registers. Each of the shift registers includes a shift register unit, which contains multiple TFTs and multiple capacitors, an N-th output terminal GN, an (N+1)-th output terminal GN+1, a high voltage signal terminal Vgh and a low voltage signal terminal Vgl; and an output control unit having an N-th additional output terminal. The output control unit is configured to control a time period during which the N-th additional output terminal outputs a high voltage level to be within a time period during which the N-th output terminal outputs the high voltage level, where a signal falling edge for turning off TFTs at a former one of two adjacent rows of pixel units is completely separated from a signal rising edge for turning on TFTs at a latter one.

15 Claims, 9 Drawing Sheets

(51) Int. Cl.
  *G09G 3/20* (2006.01)
  *G09G 3/32* (2016.01)
  *H04N 5/374* (2011.01)
  *H04N 5/376* (2011.01)

(52) U.S. Cl.
  CPC ... *H04N 5/3765* (2013.01); *G09G 2300/0857* (2013.01); *G09G 2310/0286* (2013.01); *G09G 2320/0209* (2013.01)

(58) Field of Classification Search
  CPC ... G09G 2300/0857; G09G 2320/0209; G11C 19/287
  See application file for complete search history.

(56) References Cited

U.S. PATENT DOCUMENTS

| | | | |
|---|---|---|---|
| 2008/0252622 A1* | 10/2008 | Tai | G09G 3/3674 345/204 |
| 2010/0007649 A1* | 1/2010 | Tanikame | G09G 3/3233 345/213 |
| 2011/0116592 A1* | 5/2011 | Tsai | G11C 19/184 377/79 |
| 2011/0267326 A1* | 11/2011 | Kim | G09G 3/3677 345/211 |
| 2012/0169703 A1* | 7/2012 | Yang | G11C 19/184 345/212 |
| 2012/0175618 A1* | 7/2012 | Yamada | H01L 27/14663 257/59 |
| 2012/0293467 A1* | 11/2012 | Lee | G09G 3/3677 345/204 |

FOREIGN PATENT DOCUMENTS

| | | |
|---|---|---|
| CN | 101290750 A | 10/2008 |
| CN | 101630475 A | 1/2010 |
| CN | 101866697 A | 10/2010 |
| CN | 103137058 A | 6/2013 |
| CN | 103226927 A | 7/2013 |

\* cited by examiner

AMORPHOUS SILICON GATE DRIVING CIRCUIT, FLAT PANEL SENSOR AND DISPLAY DEVICE

This application claims priority to Chinese patent application No. 201310733038.5, entitled "AMORPHOUS SILICON GATE DRIVING CIRCUIT, FLAT PANEL SENSOR AND DISPLAY DEVICE", filed on Dec. 26, 2013, the content of which is incorporated herein by reference in its entirety.

FIELD OF THE INVENTION

The present invention relates to the field of flat panel sensor technologies, and in particularly to an amorphous silicon gate driving circuit, a flat panel sensor and a display device.

BACKGROUND OF THE INVENTION

A flat panel sensor is a device for converting incident light, such as X-ray, visible light or infrared light, into an electrical signal according to the intensity of the incident light. When incident light is reflected by or transmitted through an object, effects of absorption, reflection and scattering occur. Because of different structures in different regions of the object, light reflected by or transmitted through the different regions of the object may have different intensities, which can be represented through a flat panel sensor, thus a grayscale diagram showing corresponding relations between the incident lights and surfaces or inner structures of the object is formed to facilitate analysis of the object. The flat panel sensor is widely used in the field of healthcare, safety inspection and industrial non-destructive detection because the flat panel sensor can effectively carry out non-destructive detection of objects.

SUMMARY OF THE INVENTION

In view of the above, a feature of the present invention is to provide an amorphous silicon gate driving circuit, a flat panel sensor and a display device to separate a signal falling edge for turning off an upper row and a signal rising edge for turning on a lower row of two adjacent scanning lines.

In one embodiment of the present invention, an amorphous silicon gate driving circuit includes a plurality of cascaded shift registers, where each of the shift registers comprises: a shift register unit, which comprises a plurality of TFTs and a plurality of capacitors, and is provided with an N-th output terminal, an (N+1)-th output terminal, a high voltage signal terminal and a low voltage signal terminal; an output control unit, which is provided with an N-th additional output terminal and is configured to control a time period during which the N-th additional output terminal outputs a high voltage level to be within a time period during which the N-th output terminal outputs a high voltage level, wherein N is a positive integer greater than or equal to 1.

In another embodiment, a flat panel sensor includes the above-described amorphous silicon gate driving circuit and a pixel array.

In yet another embodiment, a display device includes the above-described flat panel sensor.

A signal falling edge for turning off TFTs at a former one of two adjacent rows of pixel units is completely separated from a signal rising edge for turning on TFTs at a latter one of the two adjacent rows of pixel units, to avoid the crosstalk caused by the latency of the ASG driving circuit. Further, a time interval between the time for turning on TFTs at two adjacent rows of pixel units can be adjusted as desired, and a flat panel sensor with relative small area can be achieved due to the smaller sized ASG driving circuit.

DETAILED DESCRIPTION OF THE EMBODIMENTS

Certain embodiments of the present disclosure will be described in combination with the drawings. It is appreciated that the embodiments described here are merely used for the description of the present invention and not limiting. It is understood that only those parts that are relevant to the present invention are presented, and well-known circuits, structures, and techniques have not been shown in order not to obscure the understanding of the description.

Figure 1:
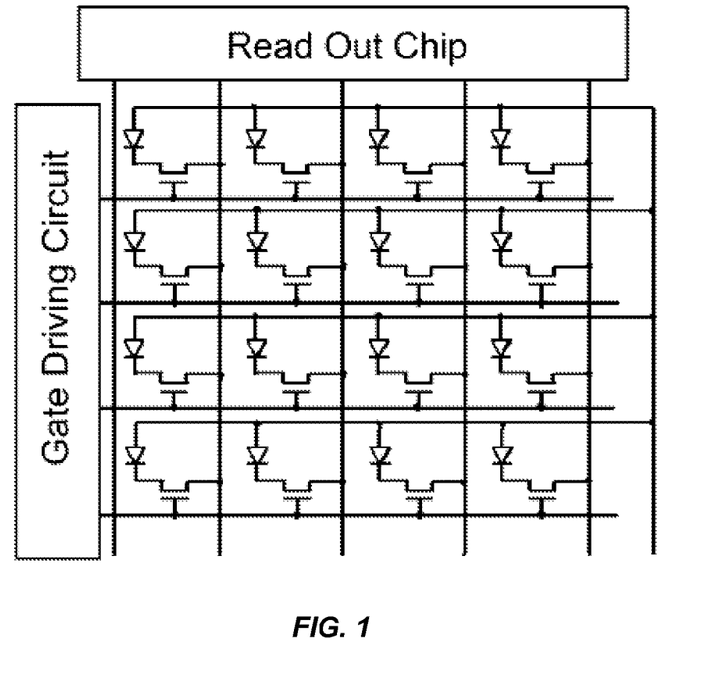
FIG. 1 is a simplified block diagram showing a structure of a flat panel sensor.

FIG. 1 is a simplified block diagram showing a structure of a flat panel sensor. As illustrated in FIG. 1, the flat panel sensor includes a pixel array, a plurality of scan lines (i.e. gate lines) and a plurality of data lines, where the scan lines intersect with the data lines, each of the scan lines is connected to the gates of the transistors in a corresponding row of pixel units, and each of the data lines is connected to the sources or drains of the transistors in a corresponding column of pixel units. Each pixel unit in the pixel array includes a photodiode configured to convert incident light into an electrical signal and a Thin Film Transistor (TFT) functioning as a pixel switch to turn on or off the pixel unit. Gates of TFTs of each row of pixel units are connected to the same scan line, drains of TFTs of each column of pixel units are connected to the same data line, the scan lines are controlled by a gate driving circuit, and the data lines are controlled by a read out Integrated circuit (IC).

Currently, a silicon gate driving circuit is commonly used as the gate driving circuit of a flat panel sensor, and the silicon gate driving circuit is bonded on the flat panel sensor in a process of Film on Glass (FOG) or Chip on Glass (COG), to implement the electrical connection and conduction between the flat panel sensor and the gate driving circuit, where the COG bonding process is more commonly employed.

Figure 2:
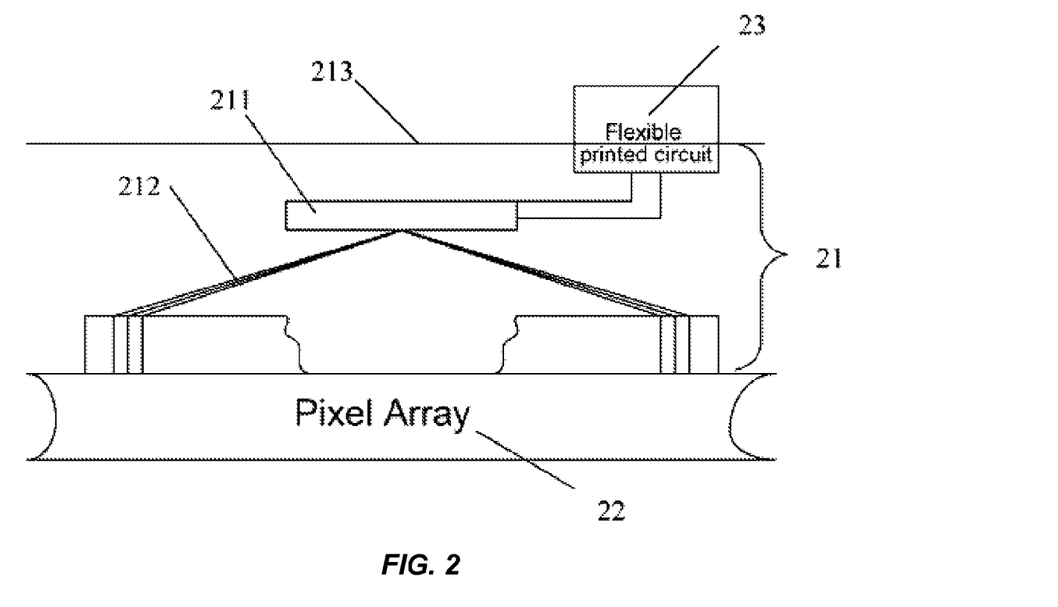
FIG. 2 is a simplified layout diagram showing the arrangement of a gate driving circuit in a circuit layout.

FIG. 2 is a simplified layout diagram showing the arrangement of a gate driving circuit in a pixel array circuit layout. As illustrated in FIG. 2, a structure obtained through the COG bonding process includes a gate driving circuit chip 211 and a pixel array 22, and the gate driving circuit chip 211 is electrically connected to a flexible printed circuit (FPC) 23 to input signals into the flexible printed circuit (FPC) 23. The arrangement of the peripheral wirings 212 of the flat panel sensor is illustrated in FIG. 2, and the peripheral wirings are arranged in a fan-shaped region, i.e., a fan-shaped wiring arrangement. To prevent the area of the pixel array 22 from being compressed and flattened by a bonding machine during the COG bonding process, the gate driving circuit chip needs to be spaced apart from the area of the pixel array by a certain distance; in addition, the flexible printed circuit is also bound onto the flat panel sensor by a pressing process, thus the flexible printed circuit needs to be spaced apart from the gate driving chip by a certain distance; of course, the gate driving circuit chip and the FPC per se also occupy some space. Therefore, a periphery part 21 of the gate driving circuit, that is, the part from the periphery of the pixel array to a cutting line 213 of the flat panel sensor (i.e. the shaped edge of the flat panel sensor) has a width of 12 mm to 15 mm.

A relatively big flat panel sensor will not be affected by the periphery part 21 with a width of 12 mm to 15 mm. However, for middle and small sized flat panel sensors provided with only tens or hundreds of scan lines, they will be affected largely by the periphery part 21 with a width of 12 mm to 15 mm. For example, because the peripheral part occupies a too large space, therefore the mechanical dimension cannot meet actual application requirements. Furthermore, it is difficult to perform the FOG or COG bonding process on a small-sized flat panel sensor including a relatively large peripheral part, such as a flat panel sensor having an array area of a dimension of a few centimeters, due to alignment and press fitting difficulties, thus the production difficulty is increased and the yield is low; in addition, the peripheral circuit will have a larger size due to the utilization of the silicon gate driving circuit, thus the whole flat panel sensor is too large to satisfy the mechanical requirements.

Among gate driving circuits in the prior art, an amorphous silicon gate (ASG) driving circuit is formed by amorphous silicon Thin Film Transistors (TFTs) so there is certain delay (latency), that means that there is a time overlap between a falling edge of a signal for turning off TFTs in one row of unit pixels and a rising edge of a signal for turning on TFTs in the next row of unit pixels, leading to the case where the TFTs in the next row of unit pixels are already turned on before the TFTs in the preceding row of unit pixels are turned off, which will cause incorrect readout of signals from the flat panel sensor, limit the application of the ASG driving circuit in the flat panel sensor.

Figure 3:
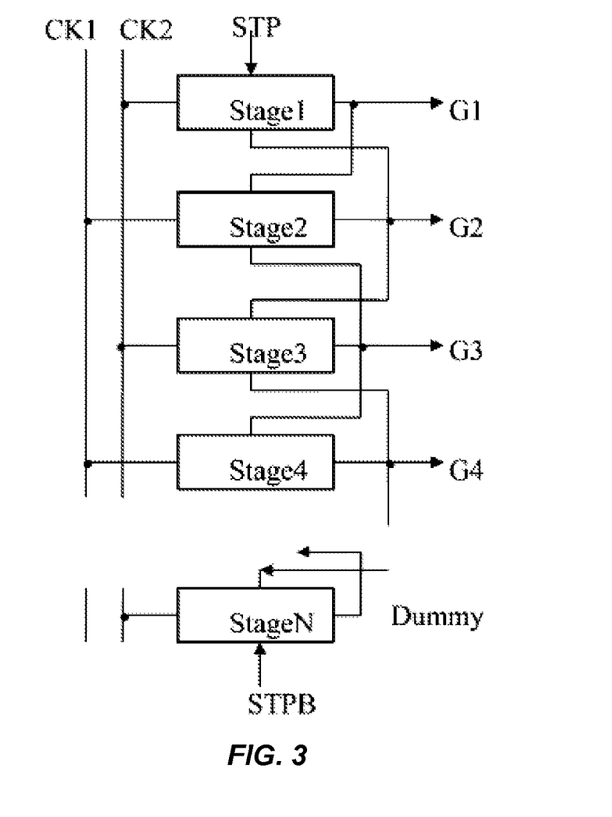
FIG. 3 is a simplified block diagram showing an amorphous silicon gate driving circuit.
Figure 4:
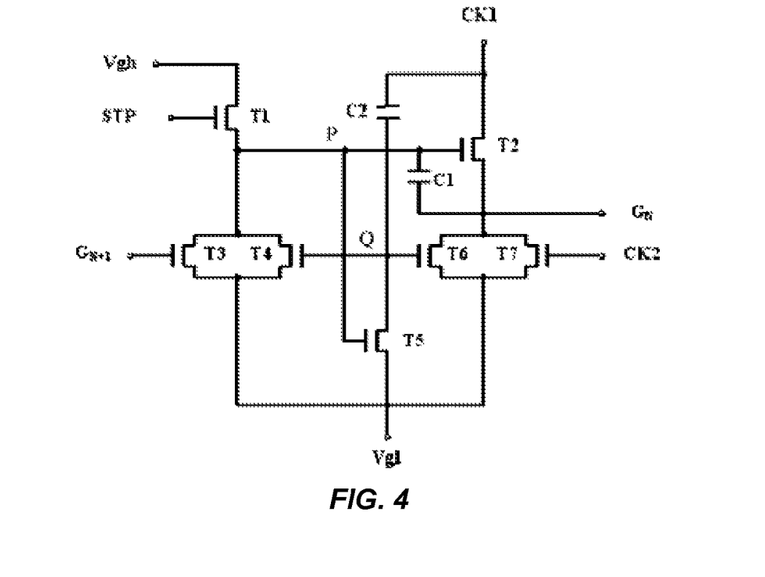
FIG. 4 is a simplified block diagram showing a shift register circuit of an amorphous silicon gate driving circuit.
Figure 5:
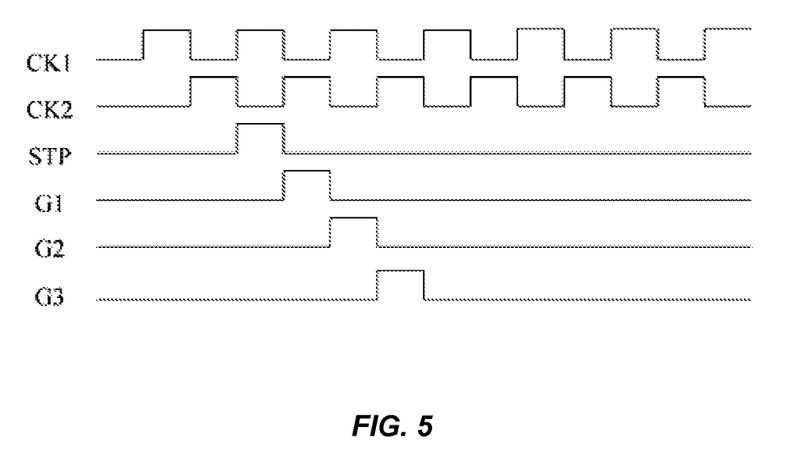
FIG. 5 is a timing diagram of an amorphous silicon gate driving circuit.

FIG. 3 is a simplified block diagram showing an amorphous silicon gate driving circuit, FIG. 4 is a simplified diagram showing a shift register circuit of an amorphous silicon gate driving circuit, and FIG. 5 is a timing diagram of an amorphous silicon gate driving circuit.

As illustrated in FIG. 3, a common amorphous silicon gate driving circuit includes a number Y of cascaded shift register stages (represented by Stage 1, Stage 2, . . . , Stage N), where the final stage of the shift register is a dummy register. The cascaded Y shift registers may be turned on one by one in sequence. As illustrated in FIG. 4, every stage of the shift register includes a plurality of thin film transistors and capacitors. The time sequence diagram of the ASG driving circuit is shown in FIG. 5. Reference to FIG. 3, when an external driving signal STP is received by the first stage of the shift register, a first gate driving signal G1 is outputted by the first stage of the shift register. The first gate driving signal G1 is delayed by a clock pulse width compared with the external driving signal STP, and turns on TFTs in a first row of pixel units, so that signals at sources of the TFTs in the first row of pixel units are written; meanwhile, the first gate driving signal G1 triggers a next stage of shift register to operate. When the next stage of the shift register starts operating, a second gate driving signal G2 is outputted, where the second gate driving signal G2 is fed back to and turns off the preceding stage of the shift register. The final stage of the shift register is turn off by the dummy register through an external turning off signal STPB.

As such, because of the latency of the signal rising edge and the signal falling edge in the ASG driving circuit, the time overlapping between the signal falling edge for turning off TFTs in a former one of two adjacent rows of pixel units and the signal rising edge for turning on TFTs in the latter one of the two adjacent rows of pixel units cannot be completely avoided in the application of a flat panel sensor, thus limits the application of the ASG driving circuit in the flat panel sensor.

Figure 6:
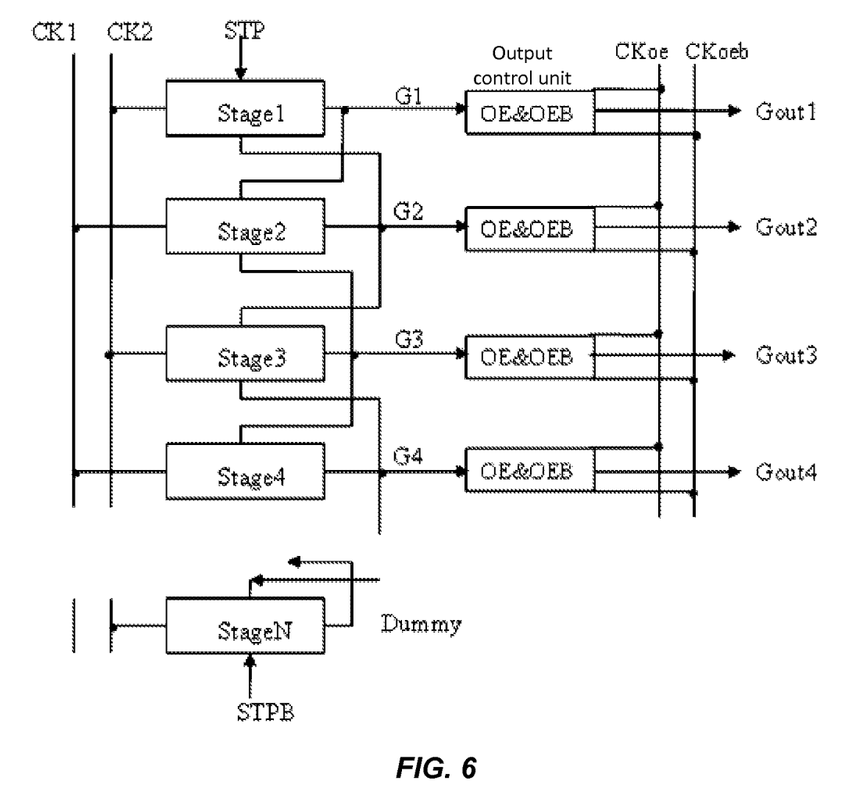
FIG. 6 is a simplified block diagram showing an amorphous silicon gate driving circuit according to an embodiment of the present invention.
Figure 7:
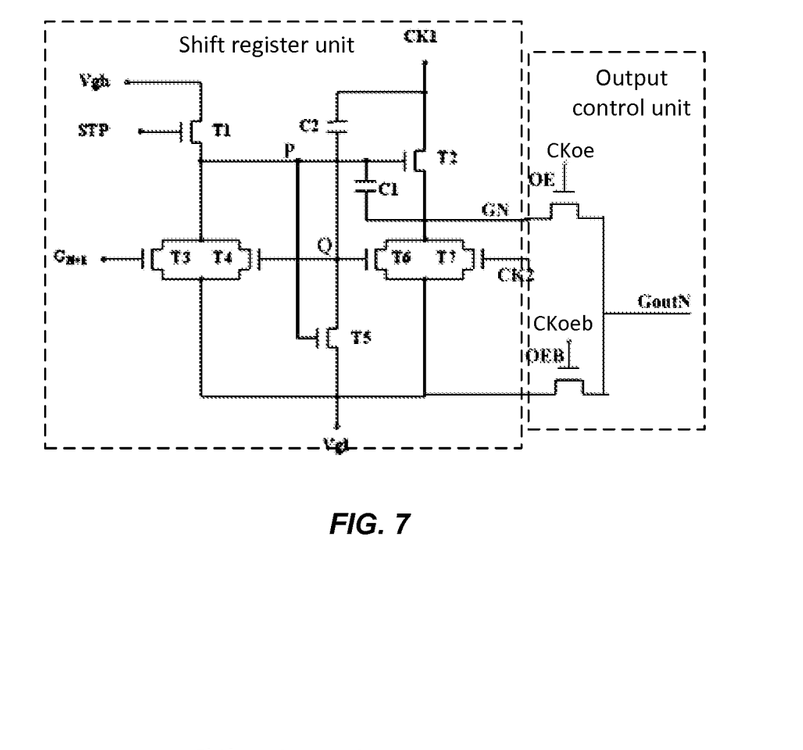
FIG. 7 is a simplified block diagram showing a shift register circuit of the amorphous silicon gate driving circuit according to an embodiment of the present invention.
Figure 8:
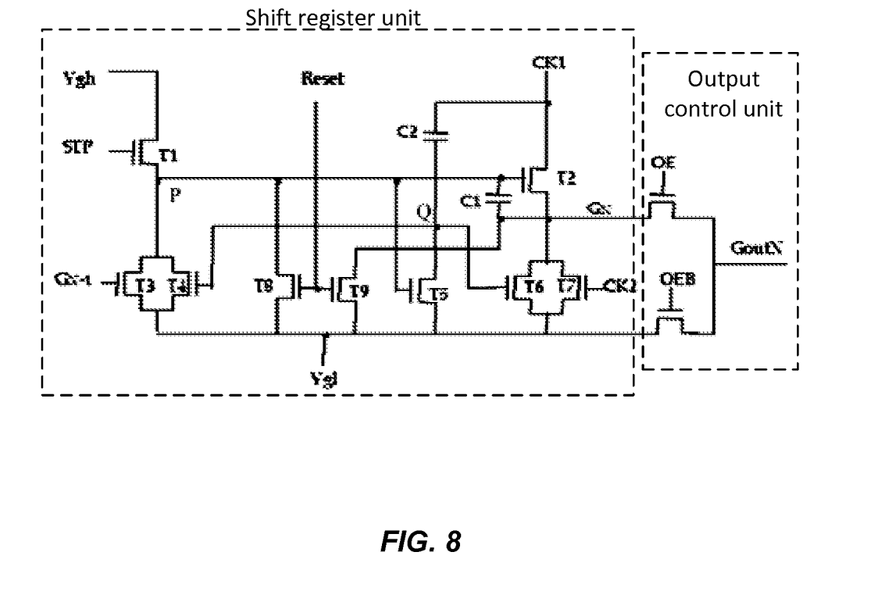
FIG. 8 is a simplified block diagram showing another a shift register circuit of the amorphous silicon gate driving circuit according to an embodiment of the present invention.

FIG. 6 is a simplified block diagram showing an amorphous silicon gate driving circuit according to an embodiment of the present invention, FIG. 7 is a simplified circuit diagram showing a shift register circuit of an amorphous silicon gate driving circuit according to an embodiment of the present invention, and FIG. 8 is a simplified circuit diagram showing another shift register circuit of an amorphous silicon gate driving circuit according to an embodiment of the present invention.

As illustrated in FIGS. 6 and 7, an amorphous silicon gate driving circuit is provided in an embodiment of the present invention, and the amorphous silicon gate driving circuit includes a plurality of cascaded shift registers, each of which includes a shift register unit and an output control unit. The shift register unit includes a plurality of TFTs and a plurality of capacitors, and has an N-th output terminal GN, an (N+1)-th output terminal GN+1 (connected to an output terminal of a next shift register unit), a high voltage signal terminal Vgh and a low voltage signal terminal Vgl. The output control unit has an N-th additional output terminal GoutN to control a time period during which the N-th additional output terminal GoutN outputs a high voltage level to be within a time period during which the N-th output terminal GN outputs the high voltage level, where N is a positive integer greater than or equal to 1, that is, N≥1.

As illustrated in FIGS. 6 to 8, the output control unit includes a first additional TFT OE and a second additional TFT OEB. Further, a gate of the first additional TFT OE is connected to an external first clock signal CKoe, a first electrode of the first additional TFT OE is connected to the N-th output terminal GN, and a second electrode of the first additional TFT OE is connected to the N-th additional output terminal GoutN. A gate of the second additional TFT OEB is connected to an external second clock signal CKoeb, a first electrode of the second additional TFT OEB is connected to the low voltage signal terminal Vgl, and a second electrode of the second additional TFT OEB is connected to the N-th additional output terminal GoutN.

The shift register circuit is formed by an a-Si (amorphous silicon) process, which causes the latency of the signal rising edge and the signal falling edge of a shift register. Because signals from the sources of pixels need to be correctly read out in a flat panel sensor using such shift register circuit, the time of the signal falling edge for turning off TFTs in a former one of two adjacent rows of pixel units shall not overlap with the time of the signal rising edge for turning on TFTs in a latter one of the two adjacent rows of pixel units, that is, the signal falling edge of the N-th row of pixel units is separated from the signal falling edge of the (N+1)-th row of pixel units by the scan line driving circuit, so that there is an interval between the time for turning off TFTs in a former one of two adjacent rows of pixel units and the time for turning on TFTs in a latter one of the two adjacent rows of pixel units.

Compared with the shift register in the prior art, the shift register provided by an embodiment of the present invention additionally includes two TFTs, i.e., a first additional TFT OE and a second additional TFT OEB, which are configured to control the output period of each gate driving signal in such a way that a time period during which the N-th additional output terminal GoutN outputs a high voltage level is within a time period during which the N-th output terminal GN outputs the high voltage level, thus the falling edge of a signal for turning off TFTs of the N-th row of pixel units and the rising edge of a signal for turning on TFTs of the (N+1)-th row of pixel units are separated. Further, the high voltage level duration and the low voltage level duration of any of the first clock signal CKoe and the second clock signal Coe can be adjusted as required, to control the interval between the time for turning on TFTs in one of two adjacent rows of pixel units and the time for turning on TFTs in the other of two adjacent rows of pixel units.

Furthermore, as can be seen from FIG. 6, the mode of operation of the shift register has not changed, that is, the turning on of the N-th output terminal GN (i.e. the outputting of the N-th output terminal GN) is controlled by the (N−1)-th output terminal GN−1, the turning off of the (N−1)-th output terminal GN−1 (i.e. the stopping of the (N−1)-th output terminal GN−1) is controlled by the N-th output terminal GN, and the turning on of the (N+1)-th output terminal GN+1 is also controlled by the N-th output terminal GN. However, the transmission of a signal from each stage of shift register to a scan line is changed, to separate the time for turning on TFTs in one of two adjacent rows of pixel units from the time for turning on TFTs in the other of the two adjacent rows of pixel units.

As illustrated in FIG. 6 and FIG. 7, gates of the first additional TFTs OE of all shift registers are connected together and controlled by the same first clock signal CKoe, and gates of the second additional TFTs OEB of all shift registers are connected together and controlled by the same second clock signal CKoeb.

Since the gates of the first additional TFTs OE of all stages of shift registers are connected together and controlled by the first clock signal CKoe which thus controls the turning on or off of the first additional TFTs, and the gates of the second additional TFTs OEB of all stages of shift registers are connected together and controlled by the second clock signal CKoeb which thus controls the turning on or off of the second additional TFTs OEB, the time period of outputting a high voltage level from the N-th additional output terminal GoutN may be controlled by the first additional TFT OE and the second additional TFT OEB, to obtain a time interval between two high voltage levels respectively outputted from two adjacent stages of shift registers, so that the signal falling edge for turning off TFTs in a former one of two adjacent rows of pixel units and the signal rising edge for turning on TFTs in a latter one of the two adjacent rows of pixel units can be separated by time.

In an embodiment of the present invention, as illustrated in FIG. 7, a shift register unit includes a first TFT T1, a second TFT T2, a third TFT T3, a fourth TFT T4, a fifth TFT T5, a sixth TFT T6, a seventh TFT T7, a first capacitor C1 and a second capacitor C2. A first electrode of the first TFT T1 is connected to the high voltage signal terminal Vgh; a second electrode of the first transistor T1, a gate of the second TFT T2, a first electrode of the third TFT T3, a first electrode of the fourth TFT T4 and a gate of the fifth TFT T5 are all connected to a junction (node) P (i.e. a voltage level pulling up point), and a first plate of the first capacitor C1 is connected to the junction (node) P; a second electrode of the third TFT T3, a second electrode of the fourth TFT T4, a first electrode of the fifth TFT T5, a first electrode of the sixth TFT T6 and a first electrode of the seventh TFT T7 are connected to the low voltage signal terminal Vgl; a gate of the fourth TFT T4, a gate of the sixth TFT T6 and a second electrode of the fifth TFT T5 are all connected to a junction (node) Q (i.e. a voltage level pulling down point), and a first plate of the second capacitor C2 is connected to the junction (node) Q; a second plate of the first capacitor C1, a first electrode of the second TFT T2, a second electrode of the sixth TFT T6 and a second electrode of the seventh transistor T7 are connected to the N-th output terminal GN; and a gate of the third TFT T3 is connected to the (N+1)-th output terminal GN+1.

A second plate of the second capacitor C2 and a second electrode of the second TFT T2 are connected to a third clock signal CK1; a gate of the seventh TFT T7 is connected to a fourth clock signal CK2; and a gate of the first TFT T1 is connected to a drive triggering signal STP. A drive triggering signal for the first stage of shift register in the amorphous silicon gate driving circuit is the initial drive triggering signal STP, and a drive triggering signal for each subsequent stage of shift register in the amorphous silicon gate driving circuit is formed by the output signal of the preceding stage of shift register in the amorphous silicon gate driving circuit.

In another embodiment of the present invention, as illustrated in FIG. 8, a shift register unit includes a first TFT T1, a second TFT T2, a third TFT T3, a fourth TFT T4, a fifth TFT T5, a sixth TFT T6, a seventh TFT T7, an eighth TFT T8, a ninth TFT T9, a first capacitor C1 and a second capacitor C2. A first electrode of the first TFT T1 is connected to the high voltage signal terminal Vgh; a second electrode of the first transistor T1, a gate of the second TFT T2, a first electrode of the third TFT T3, a first electrode of the fourth TFT T4, a gate of the fifth TFT T5 and a first electrode of the eighth TFT T8 are all connected to a junction (node) P (i.e. a voltage level pulling up point), and a first plate of the first capacitor C1 is connected to the junction (node) P; a second electrode of the third TFT T3, a second electrode of the fourth TFT T4, a first electrode of the fifth TFT T5, a first electrode of the sixth TFT T6, a first electrode of the seventh TFT T7, a second electrode of the eighth TFT and a second electrode of the ninth transistor T9 are connected to the low voltage signal terminal Vgl; a gate of the fourth TFT T4, a gate of the sixth TFT T6 and a second electrode of the fifth TFT T5 are all connected to a junction (node) Q (i.e. a voltage level pulling down point), and a first plate of the second capacitor C2 is connected to the junction (node) Q; a second plate of the first capacitor C1, a first electrode of the second TFT T2, a second electrode of the sixth TFT T6, a second electrode of the seventh transistor T7 and a first electrode of the ninth transistor T9 are connected to the N-th output terminal GN; and a gate of the third TFT T3 is connected to the (N+1)-th output terminal GN+1, a second electrode of the eighth TFT T8, and a gate of the ninth TFT are connected to a reset signal terminal.

A second plate of the second capacitor C2 and a second electrode of the second TFT T2 are connected to a third clock signal CK1; a gate of the seventh TFT T7 is connected to a fourth clock signal CK2; and a gate of the first TFT T1 is connected to a drive triggering signal STP. A drive triggering signal for the first stage of shift register in the amorphous silicon gate driving circuit is the initial drive triggering signal STP, and a drive triggering signal for each subsequent stage of shift register in the amorphous silicon gate driving circuit is formed by the output signal of the preceding stage of shift register in the amorphous silicon gate driving circuit.

It should be noted that the amorphous silicon gate driving circuit of the present invention is not limited to the above embodiments, but includes any amorphous silicon gate driving circuit which can achieve the present invention. In the prior art, there are various existing amorphous silicon gate driving circuits, each of which includes a plurality of thin film transistors and a plurality of capacitors. Embodiments of the present invention improve such existing amorphous silicon gate driving circuits by introducing a function of completely separating a signal falling edge for turning off TFTs in a former one of two adjacent rows of pixel units and a signal rising edge for turning on TFTs in a latter one of the two adjacent rows of pixel units, thus the present invention is not merely limited to the amorphous silicon gate driving circuits as described in the embodiments of the present invention.

Figure 9:
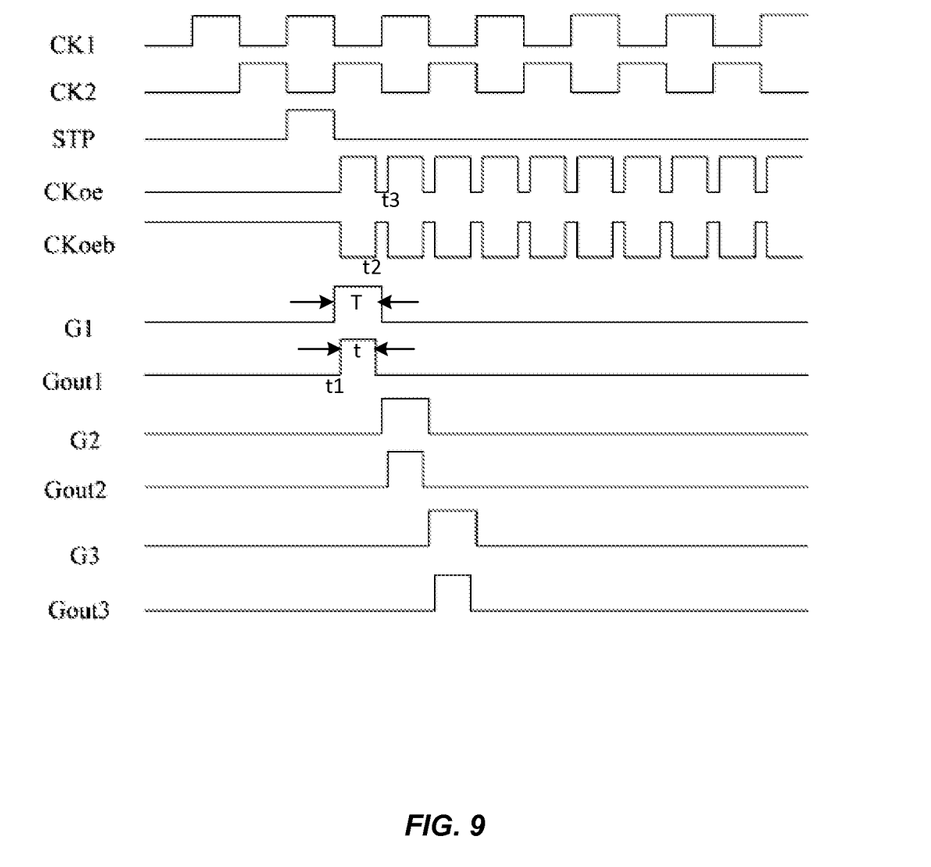
FIG. 9 is a timing diagram of the amorphous silicon gate driving circuit according to an embodiment of the present invention.

FIG. 9 is a time sequence diagram of an amorphous silicon gate driving circuit according to an embodiment of the present invention. As illustrated in FIG. 9, the third clock signal CK1 and the fourth clock signal CK2 are rectangular waveform signals and are inverse to each other. In use, the amorphous silicon gate driving circuit is triggered by an external driving signal STP, which is a signal with a single rectangular pulse. Optionally, the first clock signal CKoe is inverse to the second clock signal CKoeb, and a time period of the high voltage level of the first clock signal CKoe is within a time period of the high voltage level or low voltage level of the third clock signal CK1.

As can be seen in FIG. 9, when a high voltage level is outputted by the N-th additional output terminal and the first clock signal CKoe is at a high voltage level at t1, the first additional TFT OE is controlled to be turned on and the N-th additional output terminal GoutN outputs a high voltage level, so that TFTs in a row of pixel units corresponding to the N-th additional output terminal GoutN are turned on, and the voltage levels at the sources of the TFTs in the row of pixel units can be read. After the TFTs in this row of pixel units are turned on for some time, the first clock signal CKoe switches to a low voltage level at t2 and hence the first additional TFT OE is turned off, but meanwhile the second clock signal CKoeb switches to a high voltage level, thus the second additional TFT OEB is turned on under the control of the second clock signal CKoeb. Because the source of the second additional TFT OEB is connected to the low voltage level Vgl, even when the high voltage level is outputted by the N-th output terminal GN, the N-th additional terminal GoutN is maintained at the low voltage level, thus the TFTs in this row of pixel units are not turned on (i.e. in an off state) until the first clock signal CKoe returns to the high voltage level at t3 to turn on TFTs in the next row of pixel units, and therefore, the time for turning on TFTs in a row of pixel units is separate from the time for turning off TFTs in the next row of pixel units by a certain time interval. Further, as can be seen from FIG. 9, the time period "t" during which the N-th additional output terminal GoutN outputs a high voltage level is within the time period "T" during which the N-th output terminal GN outputs a high voltage level.

Figure 10A:
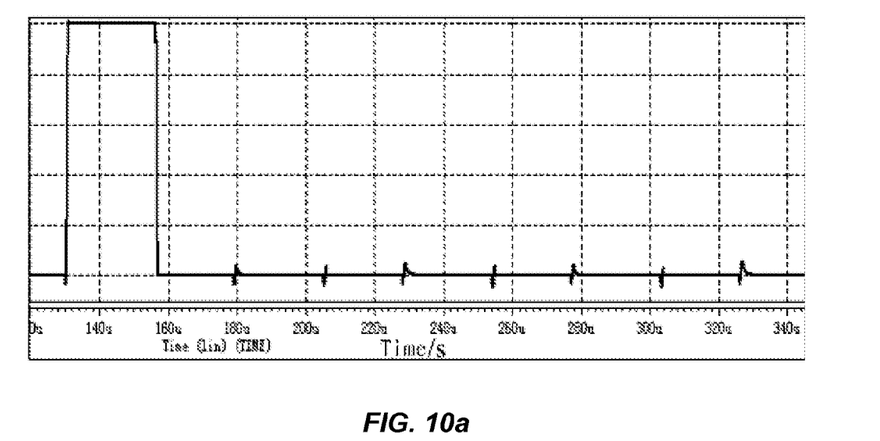
FIGS. 10a to 10c are graph diagrams showing simulation results of the amorphous silicon gate driving circuit according to an embodiment of the present invention, where the first additional TFTs of all the shift registers and the second additional TFTs of all the shift registers are respectively controlled by the same signals.
Figure 10B:
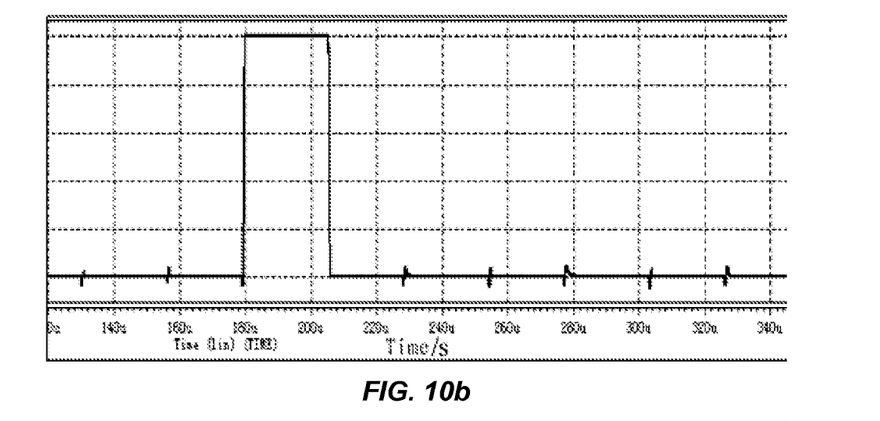
Figure 10C:
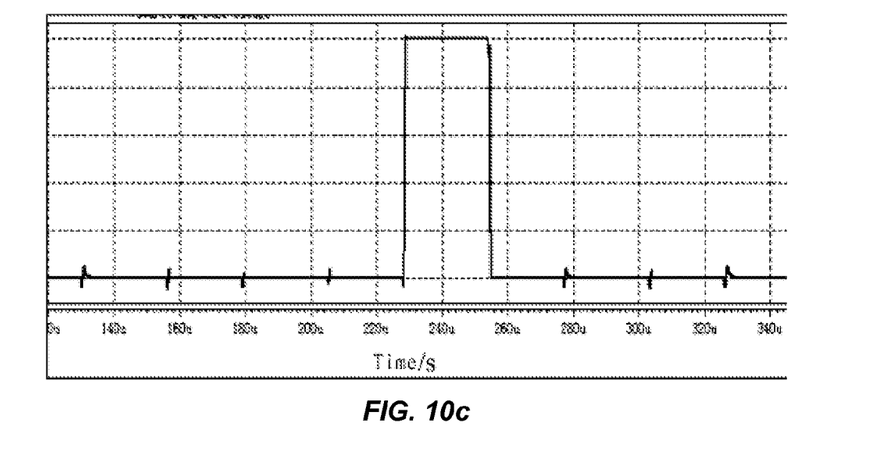
Figure 11A:
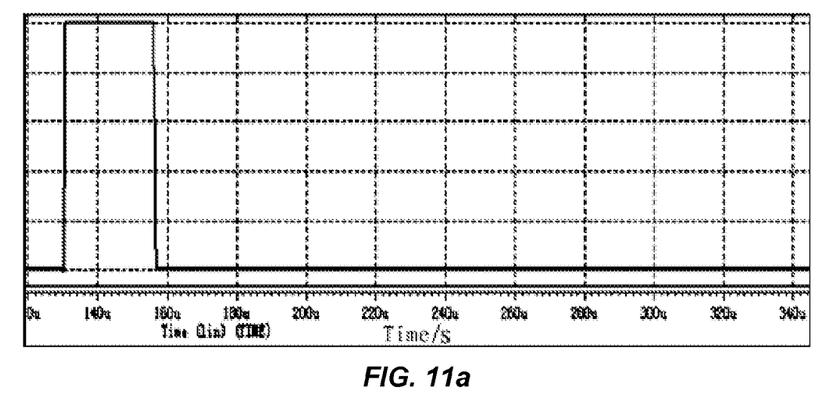
FIGS. 11a to 11c are graph diagrams showing simulation results of the amorphous silicon gate driving circuit according to an embodiment of the present invention, where the first additional TFTs of the shift registers and the second additional TFTs of the shift registers are respectively controlled by different signals.
Figure 11B:
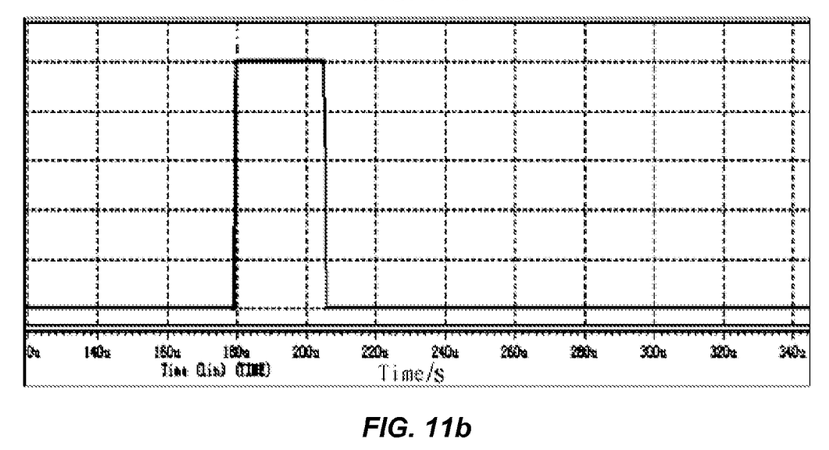
Figure 11C:
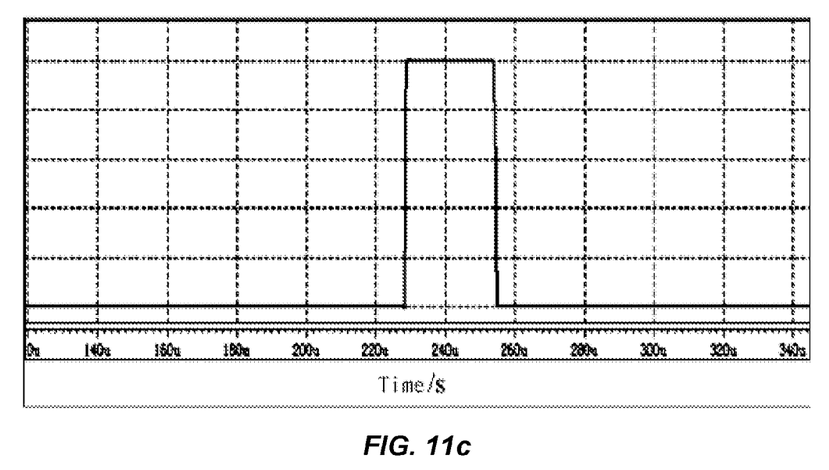

FIGS. 10a to 10c are diagrams of simulation results of an amorphous silicon gate driving circuit according to an embodiment of the present invention, where the first additional TFTs of all the shift registers and the second additional TFTs of all the shift registers are respectively controlled by the same signals. FIGS. 11a to 11c are diagrams of simulation results of an amorphous silicon gate driving circuit according to an embodiment of the present invention, where the first additional TFTs of the shift registers and the second additional TFTs of the shift registers are respectively controlled by different signals. The ASG driving circuit additionally provided with the first additional transistor OE and the second additional transistor OEB are simulated. As illustrated in FIGS. 10a to 10c, there are some fluctuations at the N-th additional output terminal Gout when the N-th additional output terminal Gout does not output a high voltage level. To verify the source of the fluctuations at the N-th additional output terminal Gout, the first additional transistor OE and the second additional transistor OEB of each shift register are respectively controlled by independent signals for simulation. As illustrated in FIGS. 11a to 11c, it turns out that there is no fluctuation at the N-th additional output terminal Gout when the N-th additional output terminal Gout does not output a high voltage level. Therefore, the fluctuation at the N-th additional output terminal Gout not outputting a high voltage level is caused by the first additional transistor OE or the second additional transistor OEB which controls the turning on or off of TFTs at other rows of pixel units.

Hence if there are K (which is a positive integer and K≥2) rows of scan lines, and gates of first additional TFTs OE or second additional TFTs OEB of shift registers corresponding to the K rows of scan lines are controlled by the same signal, then at the moment when the TFTs connected to the M-th row of scan line are turned on or off, the fluctuation will be caused to other K−1 rows of scan lines, and hence affect signal lines through the capacitive coupling effect, rendering noises on a displayed image. Although the fluctuation on the scan lines can be eliminated by such a design that the gate of the first additional TFT OE or the second additional TFT OEB of each shift register is controlled by an independent signal, the circuit layout and the periphery circuit will be very complicated, thus such design is inapplicable. However, the fluctuation can be alleviated as much as possible by some embodiments of the present invention.

In an embodiment, gates of first additional TFTs OE of a number Y of shift registers, which are spaced apart from one another by a number X of shift registers, are connected together and controlled by the same first clock signal CKoe, where X is a positive integer greater than or equal to 1 and Y is a positive integer greater than or equal to 2.

For example, shift registers, which are spaced apart from one another by one shift register, are controlled by the same first clock signal, that is, the first additional TFTs OE of the odd-numbered shift registers (i.e. the first shift register, the third shift register, the fifth shift register, and so on) are controlled by the same signal, and the first additional TFTs OE of the even-numbered shift registers (i.e. the second shift register, the fourth shift register, the sixth shift register, and on on) are controlled by the same first clock signal, so that the fluctuation caused for the reading of signals from the M-th row of pixel units can be reduced to (K/4−1) times. Likewise, the first additional TFTs OE of shift registers, which are spaced apart from one another by 2, 3, 4, or X shift register, are controlled by the same first clock signal, and the fluctuation caused for the reading of signals from the M-th row of pixel units can be reduced to (K/6−1), (K/8−1) or even (K/10−1) times, and so on.

In an embodiment, gates of second additional TFTs OEB of a number Y of shift registers, which are spaced apart from one another by a number X of shift registers, are connected together and controlled by the same second clock signal CKoeb, where X is a positive integer greater than or equal to 1 and Y is a positive integer greater than or equal to 2.

For example, shift registers, which are spaced apart from one another by one shift register, are controlled by the same second clock signal, that is, the second additional TFTs OEB of the odd-numbered shift registers (i.e. the first shift register, the third shift register, the fifth shift register, and so on) are controlled by the same signal, and the second additional TFTs OEB of the even-numbered shift registers (i.e. the second shift register, the fourth shift register, the sixth shift register, and on on) are controlled by the same second clock signal, so that the fluctuation caused for the reading of signals from the M-th row of pixel units can be reduced to (K/4−1) times. Likewise, the second additional TFTs OEB of shift registers, which are spaced apart from one another by 2, 3, 4, or X shift register, are controlled by the same second clock signal, and the fluctuation caused for the reading of signals from the M-th row of pixel units can be reduced to (K/6−1), (K/8−1) or even (K/10−1) times, and so on.

In the ASG driving circuit of the present invention, the time period of outputting a signal to every row of scan line can be effectively controlled, and a signal falling edge for turning off TFTs at a former one of two adjacent rows of pixel units and a signal rising edge for turning on TFTs at a latter one of the two adjacent rows of pixel units can be separated to avoid the crosstalk caused by the latency of the ASG driving circuit, further, a time interval between the time for turning on TFTs at one of two adjacent rows of pixel units and the time for turning on TFTs at the other one of the two adjacent rows of pixel units can be adjusted as desired.

In another embodiment of the present invention, shift registers spaced apart from one another by a number X of shift registers are controlled by an independent signal, so that when TFTs at a certain row of pixel units are turned on or off under the control of the first additional transistor OE or the second additional transistor OEB, the fluctuations caused to other row of pixel units (i.e. other scan lines) are reduced as possible.

An embodiment of the present invention further provides a flat panel sensor, which includes the amorphous silicon gate driving circuit described above and a pixel array above.

Optionally, the amorphous silicon gate driving circuit is integrated into the flat panel sensor.

Figure 12:
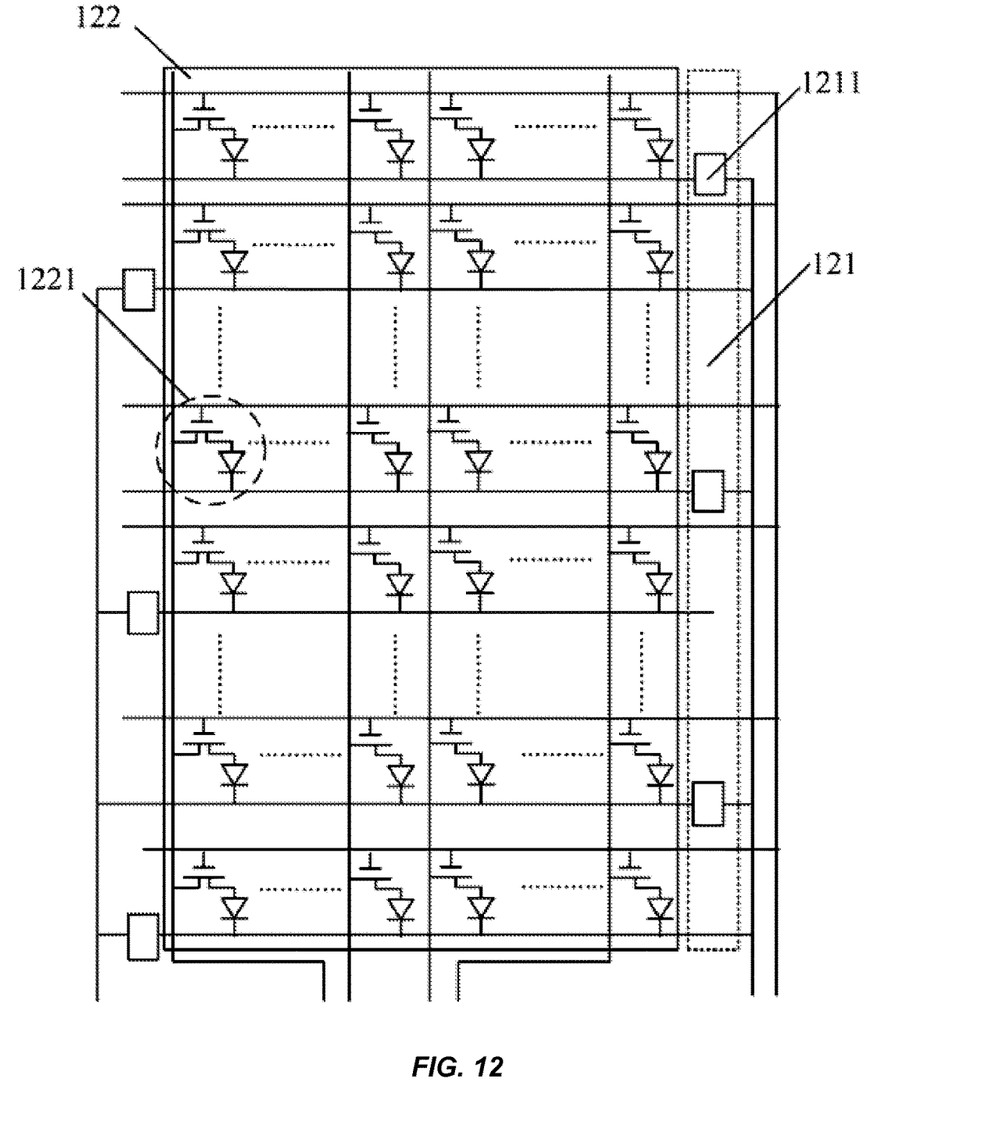
FIG. 12 is a simplified block diagram showing a flat panel sensor according to an embodiment of the present invention.

FIG. 12 is a simplified block diagram showing a flat panel sensor according to another embodiment of the present invention. As illustrated in FIG. 12, the flat panel sensor includes an amorphous silicon gate driving circuit 121 and a pixel array 122. The pixel array 122 includes a plurality of pixel units 1221 arranged in a matrix, and each of the pixel units includes a photodiode and a thin film transistor switch. The ASG driving circuit 121, which is configured to drive the pixel array 122, includes a plurality of cascaded shift registers 1211, each of which is configured to drive the corresponding pixel unit 1221.

The ASG driving circuit 121 can formed simultaneously at the process of manufacturing the amorphous silicon flat panel sensor, that is, it can be directly integrated into the flat panel sensor without any bonding process such as the COG and FOG bonding processes mentioned in the background of the present specification. The ASG driving circuit as disclosed is advantageous for its relatively small size, which width is typically less than 5 mm, and is especially suitable for the medium-sized and small-sized flat panel sensors. Further, the problem of the time overlapping between a signal falling edge for turning on TFTs at a former one of two adjacent row of pixel units and a signal rising edge for turning on TFTs at a latter one of the two adjacent rows of pixel units of conventional ASG driving circuits can be solved by embodiments of the present invention to ensure the accuracy of signals read out from the flat panel sensor.

To employ the ASG driving circuit as a driving circuit for a small sized flat panel sensor, the ASG driving circuit may be integrated into the flat panel sensor without any additional process, so that the wiring of scan lines at the periphery of the flat panel sensor is avoided; further, due to the small size of the ASG driving circuit, the dimension of the space occupied by the ASG driving circuit in the direction of the scan line is less than 5 mm, which significantly reduces the mechanical size of the flat panel sensor. Therefore, a flat panel sensor with a more compact structure, a small mechanical size and high reliability is obtained by employing the ASG driving circuit as a driving circuit for the flat panel sensor. Preferably, an amorphous silicon gate driving circuit includes a first amorphous silicon gate driving circuit and a second amorphous silicon gate driving circuit, where the first amorphous silicon gate driving circuit is located at a left side of the pixel array, and the second amorphous silicon gate driving circuit is located at a right side of the pixel array. Further, odd-numbered rows of pixel units in the pixel array are controlled by the first amorphous silicon gate driving circuit, and even-numbered rows of pixel units in the pixel array are controlled by the second amorphous silicon gate driving circuit.

By arranging the first amorphous silicon gate driving circuit and the second amorphous silicon gate driving circuit of the ASG driving circuit at two opposite sides of a pixel array, so that the odd-numbered rows of pixel units of the pixel array are controlled by the first amorphous silicon gate driving circuit located at one side of the pixel array, and the even-numbered rows of pixel units of the pixel array are controlled by the second amorphous silicon gate driving circuit located at the other side of the pixel array, assuming there are L (which is a positive integer and L≥2) rows of pixel units in the pixel array, and when signals are read out from the M-th row of pixel units, the reading is merely affected by level fluctuations of (L/2−1) rows of scan lines.

The level fluctuations of the scan lines can be further reduced in combination with signal control of the ASG driving circuit per se.

In the flat panel sensor of an embodiment of the present invention, the ASG driving circuit of the present invention is adopted to effectively control the output period a gate driving signal to every row of scan line, a falling edge of a signal for turning off TFTs at a former one of two adjacent rows of pixel units is completely separated from a rising edge of a signal for turning on TFTs at a latter one of the two adjacent rows of pixel units, to avoid the crosstalk caused by the latency of the ASG driving circuit. Further, a time interval between the time for turning on TFTs at two adjacent rows of pixel units can be adjusted as desired. Since the ASG driving circuit is integrated into the flat panel sensor, the wiring of scan lines at the periphery of the flat panel sensor is avoided; further, due to the small size of the ASG driving circuit, the dimension of the space occupied by the ASG driving circuit in the direction of the scan lines is less than 5 mm. Therefore, a flat panel sensor which adopts this ASG driving circuit as a driving circuit has advantages of a compact structure, a small mechanical dimension and high reliability, and is especially suitable for medium-sized and small-sized flat panel sensors.

Furthermore, by distributing the ASG driving circuit at both sides of the pixel array, when TFTs at a certain row of pixel units are turned on or off under the control of the first additional transistor OE or the second additional transistor OEB, the fluctuations caused to other row of scan lines are reduced as possible.

Figure 13:
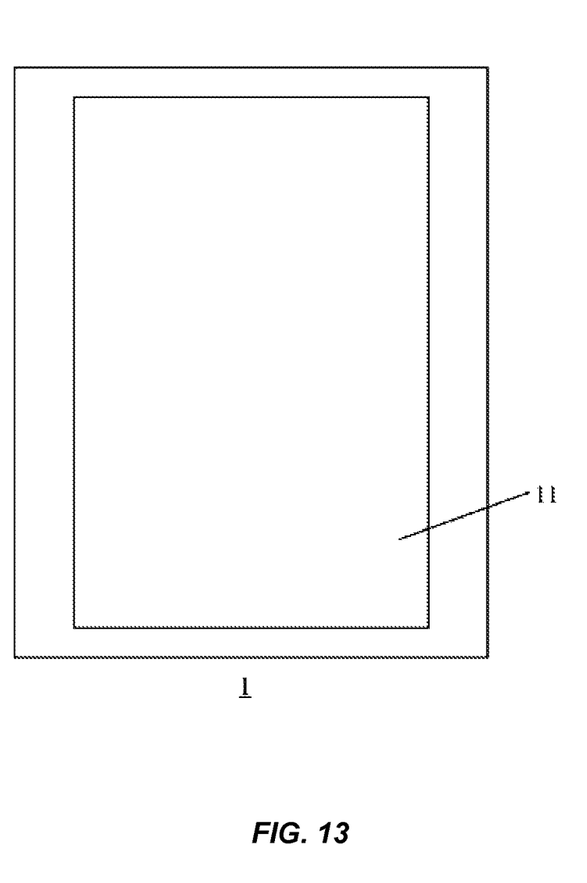
FIG. 13 is a simplified block diagram showing a display device according to an embodiment of the present invention.

FIG. 13 is a simplified block diagram showing a display device according to another embodiment of the present invention, and the display device includes the above-described flat panel sensor 11.

While the invention has been described in terms of specific embodiments, those skilled in the art will recognize that the invention can be practiced with modification within the spirit and scope of the claims.

What is claimed is:

1. An amorphous silicon gate driving circuit, comprising a plurality of cascaded shift registers, wherein an N-th shift register comprises:
    a shift register unit having a plurality of thin-film-transistors (TFTs) and a plurality of capacitors, an N-th output terminal, an (N+1)-th output terminal, a high voltage signal terminal, and a low voltage signal terminal; and
    an output control unit electrically connected to the N-th output terminal of shift register unit and having an N-th additional output terminal, wherein the output control unit is configured to control a time period during which the N-th additional output terminal outputs a high voltage level to be within a time period during which the N-th output terminal outputs the high voltage level while the (N+1)-th output terminal outputs a low voltage level, and N being a positive integer greater than or equal to 1, and
    the output control unit comprises a first additional TFT and a second additional TFT.

2. The amorphous silicon gate driving circuit according to claim 1, wherein:
    a gate of the first additional TFT is connected to a first clock signal;
    a first electrode of the first additional TFT is connected to the N-th output terminal, and a second electrode of the first additional TFT is connected to the N-th additional output terminal;
    a gate of the second additional TFT is connected to a second clock signal;
    a first electrode of the second additional TFT is connected to the low voltage signal terminal, and a second electrode of the second additional TFT is connected to the N-th additional output terminal.

3. The amorphous silicon gate driving circuit according to claim 2, wherein
    gates of the first additional TFTs of all of the shift registers are connected together and controlled by the first clock signal;
    gates of the second additional TFTs of all of the shift registers are connected together and controlled by the second clock signal.

4. The amorphous silicon gate driving circuit according to claim 3, wherein the shift register unit comprises a first TFT, a second TFT, a third TFT, a fourth TFT, a fifth TFT, a sixth TFT, a seventh TFT, a first capacitor and a second capacitor,
    a first electrode of the first TFT is connected to the high voltage signal terminal;
    a second electrode of the first transistor, a gate of the second TFT, a first electrode of the third TFT, a first electrode of the fourth TFT and a gate of the fifth TFT are connected to a first node, and a first plate of the first capacitor is connected to the first node;
    a second electrode of the third TFT, a second electrode of the fourth TFT, a first electrode of the fifth TFT, a first electrode of the sixth TFT and a first electrode of the seventh TFT are connected to the low voltage signal terminal;
    a gate of the fourth TFT, a gate of the sixth TFT and a second electrode of the fifth TFT are connected a second node, and a first plate of the second capacitor is connected to the second node;
    a second plate of the first capacitor, a first electrode of the second TFT, a second electrode of the sixth TFT and a second electrode of the seventh transistor are connected to the N-th output terminal; and a gate of the third TFT is connected to the (N+1)-th output terminal.

5. The amorphous silicon gate driving circuit according to claim 4, wherein
    a second plate of the second capacitor and a second electrode of the second TFT are connected to a third clock signal;
    a gate of the seventh TFT is connected to a fourth clock signal;
    a gate of the first TFT is connected to a drive triggering signal.

6. The amorphous silicon gate driving circuit according to claim 5, wherein the first clock signal is inverse to the second clock signal, and a high voltage level period of the first clock signal is within a high voltage level period or low voltage level period of the third clock signal.

7. The amorphous silicon gate driving circuit according to claim 2, wherein the shift register unit comprises a first TFT, a second TFT, a third TFT, a fourth TFT, a fifth TFT, a sixth TFT, a seventh TFT, a first capacitor and a second capacitor,
    a first electrode of the first TFT is connected to the high voltage signal terminal;
    a second electrode of the first transistor, a gate of the second TFT, a first electrode of the third TFT, a first electrode of the fourth TFT and a gate of the fifth TFT are connected to a first node, and a first plate of the first capacitor is connected to the first node;
    a second electrode of the third TFT, a second electrode of the fourth TFT, a first electrode of the fifth TFT, a first electrode of the sixth TFT and a first electrode of the seventh TFT are connected to the low voltage signal terminal;

a gate of the fourth TFT, a gate of the sixth TFT and a second electrode of the fifth TFT are connected a second node, and a first plate of the second capacitor is connected to the second node;

a second plate of the first capacitor, a first electrode of the second TFT, a second electrode of the sixth TFT and a second electrode of the seventh transistor are connected to the N-th output terminal;

a gate of the third TFT is connected to the (N+1)-th output terminal.

8. The amorphous silicon gate driving circuit according to claim 7, wherein a second plate of the second capacitor and a second electrode of the second TFT are connected to a third clock signal;

a gate of the seventh TFT is connected to a fourth clock signal;

a gate of the first TFT is connected to a drive triggering signal.

9. The amorphous silicon gate driving circuit according to claim 8, wherein the first clock signal is inverse to the second clock signal, and a high voltage level period of the first clock signal is within a high voltage level period or low voltage level period of the third clock signal.

10. The amorphous silicon gate driving circuit according to claim 2, wherein gates of the first additional TFTs of Y shift registers spaced apart from one another by X shift registers are connected together and controlled by the same first clock signal, X being a positive integer greater than or equal to 1 and Y being a positive integer greater than or equal to 2.

11. The amorphous silicon gate driving circuit according to claim 2, wherein gates of the second additional TFTs of Y shift registers spaced apart from one another by X shift registers are connected together and controlled by the same second clock signal, X being a positive integer greater than or equal to 1 and Y being a positive integer greater than or equal to 2.

12. A flat panel sensor comprising an amorphous silicon gate driving circuit and a pixel array, the amorphous silicon gate driving circuit, comprising a plurality of cascaded shift registers, wherein an N-th shift register comprises:

a shift register unit having a plurality of thin-film-transistors (TFTs) and a plurality of capacitors, an N-th output terminal, an (N+1)-th output terminal, a high voltage signal terminal, and a low voltage signal terminal; and an output control unit electrically connected to the N-th output terminal of shift register unit and having an N-th additional output terminal, wherein the output control unit is configured to control a time period during which the N-th additional output terminal outputs a high voltage level to be within a time period during which the N-th output terminal outputs the high voltage level while the (N+1)-th output terminal outputs a low voltage level, and N being a positive integer greater than or equal to 1, and the output control unit comprises a first additional TFT and a second additional TFT.

13. The flat panel sensor according to claim 12, wherein the amorphous silicon gate driving circuit is integrated into the flat panel sensor.

14. The flat panel sensor according to claim 13, wherein the amorphous silicon gate driving circuit comprises a first amorphous silicon gate driving circuit and a second amorphous silicon gate driving circuit;

the first amorphous silicon gate driving circuit is located at a first side of the pixel array, and the second amorphous silicon gate driving circuit is located at a second side of the pixel array opposite the first side;

odd-numbered rows of pixel units in the pixel array are controlled by the first amorphous silicon gate driving circuit;

even-numbered rows of pixel units in the pixel array are controlled by the second amorphous silicon gate driving circuit.

15. A display device comprising a flat panel sensor, the flat panel sensor comprising an amorphous silicon gate driving circuit and a pixel array, the amorphous silicon gate driving circuit, comprising a plurality of cascaded shift registers, wherein an N-th shift register comprises:

a shift register unit having a plurality of thin-film-transistors (TFTs) and a plurality of capacitors, an N-th output terminal, an (N+1)-th output terminal, a high voltage signal terminal, and a low voltage signal terminal; and an output control unit electrically connected to the N-th output terminal of shift register unit and having an N-th additional output terminal, wherein the output control unit is configured to control a time period during which the N-th additional output terminal outputs a high voltage level to be within a time period during which the N-th output terminal outputs the high voltage level while the (N+1)-th output terminal outputs a low voltage level, and N being a positive integer greater than or equal to 1, and the output control unit comprises a first additional TFT and a second additional TFT.

* * * * *